United States Patent [19]

Kager

[11] Patent Number: 4,636,740

[45] Date of Patent: Jan. 13, 1987

[54] CONTROL CIRCUIT FOR VARYING POWER OUTPUT OF PUSH-PULL TUBE AMPLIFIERS

[76] Inventor: Dennis L. Kager, 217 Regina St., Iselin, N.J. 08830

[21] Appl. No.: 883,282

[22] Filed: Jul. 7, 1986

Related U.S. Application Data

[63] Continuation of Ser. No. 602,735, Apr. 23, 1984.

[51] Int. Cl.$^4$ .......................... H03F 3/28; G10H 3/00
[52] U.S. Cl. ..................................... 330/123; 84/1.11; 84/1.19
[58] Field of Search ............... 330/123, 127, 129, 142, 330/149; 84/1.11, 1.12, 1.16, 1.19, 1.21, 1.24

[56] References Cited

U.S. PATENT DOCUMENTS

| | | | |
|---|---|---|---|
| 2,253,942 | 8/1941 | Rath | 330/142 X |
| 2,462,452 | 2/1949 | Yates . | |
| 2,462,849 | 1/1949 | Dishal | 330/123 X |
| 2,562,476 | 7/1951 | Rado | 330/123 X |
| 2,590,104 | 3/1952 | King . | |
| 2,647,174 | 7/1953 | Maron | 330/123 |
| 2,716,162 | 8/1955 | Pearlman | 330/142 X |
| 2,721,907 | 10/1955 | Jacobs | 330/142 X |
| 2,777,018 | 1/1957 | Russell | 330/123 X |
| 2,782,266 | 2/1957 | Belar | 330/123 |
| 2,802,069 | 8/1957 | Weber | 330/142 X |
| 2,844,777 | 7/1958 | Ross | 330/123 X |
| 3,005,162 | 10/1961 | Leslie | 330/123 X |
| 3,119,970 | 1/1964 | Thompson et al. | 330/123 |
| 3,129,388 | 4/1964 | Lang et al. | 330/123 |

FOREIGN PATENT DOCUMENTS 425696  3/1935  United Kingdom ................ 330/123

*Primary Examiner*—James B. Mullins
*Attorney, Agent, or Firm*—Morgan & Finnegan

[57] ABSTRACT

A biasing and control circuit for varying the output power delivered by the push-pull output stage of a power amplifier is disclosed. The biasing and control circuit incorporates both fixed and cathode biasing to allow output power to be varied without introducing distortion. A negative fixed biasing voltage is applied to the control grids of the vacuum tubes comprising the push-pull output stage, while the cathodes of such tubes are varied between ground and selected voltage levels above ground. To vary the voltage levels, the cathodes of the tubes are joined together by a common connection and coupled to ground through a variable impedance which when varied changes the conductivity of the output tubes, and thereby, the output power delivered by the amplier.

8 Claims, 1 Drawing Figure

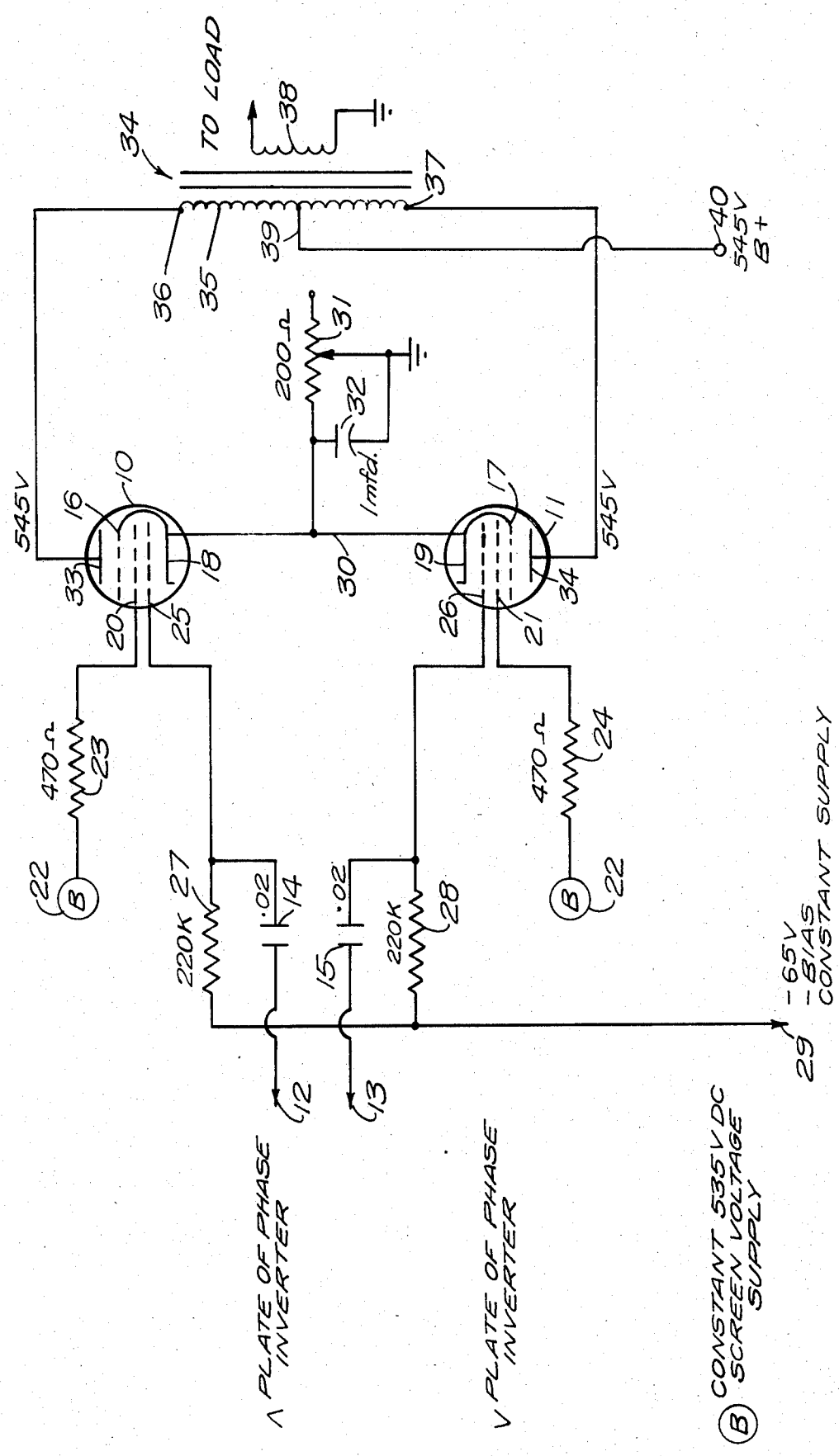

CONTROL CIRCUIT FOR VARYING POWER OUTPUT OF PUSH-PULL TUBE AMPLIFIERS

This is a continuation of co-pending application Ser. No. 602,735, filed on Apr. 23, 1984.

BACKGROUND OF THE INVENTION

The present invention is directed to vacuum tube amplifiers, and more particularly, to a biasing and control circuit for varying the level of output power of vacuum tube push-pull amplifiers.

Much of today's music is performed using electric instruments and amplification systems which allow musicians to achieve various special effects not previously possible. Certain of these special effects can be produced by introducing "clean distortion" in the output stage of an amplifier. For example, by intentionally introducing clean distortion in the output stage of the amplifier of an electric guitar, a musician can make the guitar sound like a bassoon or a tenor sax. Clean distortion can be described as a clipping of the peaks of signals which are otherwise a true (often amplified) reproduction of signals previously generated by a signal source such as an electric instrument. It is to be differentiated from other forms of distortion in that it is usually intentionally introduced for the purpose of producing desired special effects. One way clean distortion can be introduced into an amplification system is to limit the amount of output power which can be delivered by the output stage of the amplifier, while simultaneously increasing the gain of the pre-amp driving the output stage until such stage becomes overdriven.

Many of the amplifiers for electric instruments manufactured today use vacuum tubes because of the "warm" sound which they produce. Such amplifiers are typically designed with a push-pull output stage to allow the amplifiers to operate at a high level of efficiency, while simultaneously being capable of producing the substantial amounts of power often demanded by musicians. Push-pull vacuum tube amplifiers are often designed with either fixed biasing or cathode biasing to deliver a particular level of output power. In fixed biasing designs, the cathodes of the tubes comprising the push-pull output stage are normally grounded, while a negative bias is applied to the control grids of the tubes. In cathode biasing designs, the cathodes of the tubes are held at a fixed potential above ground, typically by means of a fixed high wattage resistor, and no negative bias is applied to the tubes' control grids.

Certain push-pull tube amplifiers are designed to deliver more than one level of output power, however, such amplifiers typically deliver either only a high power output or a low power output. One design of this type switches the windings of its power transformer to produce either a high or low B+working voltage, and thereby, to produce the high and low power levels. Another design utilizes four power tubes and simply lifts the cathodes of two of the tubes (one from each bank) from ground to produce the high and low power levels. Although such designs allow a user the option of two different power levels, neither provides the output variability necessary for a musician to produce special effects in accordance with the size of the location in which he is playing Variable levels of output power have been available in tube amplifiers in the past through the use of an extremely high power rheostat connected to the secondary of the amplifier's output transformer. Although the rheostat allows the output power of the amplifier to be varied, the rheostat nevertheless causes a mismatch between the impedance of the transformer's secondary winding and the impedance of the speaker loads. This mismatch causes a distortion to be introduced into the output signals of the amplifier which can not be eliminated if desired. This method of varying output power also very often causes premature failure of the output transformer and/or the power output tubes themselves.

Accordingly, it is an object of the present invention to provide an output stage for a tube amplifier which allows the output power delivered by the amplifier to be manually varied.

It is another object of the present invention to provide a biasing and control circuit for the push-pull output stage of a vacuum tube amplifier which allows the output power delivered by the output stage to be manually varied within a specified power range.

It is a further object of the present invention to provide a biasing and control circuit which allows the power output of a push-pull vacuum tube amplifier to be varied so that clean distortion can be introduced into the amplifier no matter what power output constraints are imposed on the amplifier by the size of the location in which it is used.

SUMMARY OF THE INVENTION

The present invention is a new and improved biasing and control circuit for vacuum tube amplifiers utilizing a push-pull output stage. In the present invention, both fixed and cathode biasing are employed to allow output power to be varied to a plurality of levels without introducing distortion. According to the invention, a negative fixed biasing voltage is applied to the control grids of the vacuum tubes comprising the push-pull output stage, while the cathodes of such tubes are varied between ground and selected voltage potentials above ground. To provide the selected voltage potentials, the cathodes of the tubes are joined together by a common connection and coupled to ground through a variable impedance which allows the conductivity of the output tubes to be controlled. By varying the impedance, the conductivity of the output tubes is proportionately varied so that any level of output power within a specified range can be selected. The variable impedance can be a variable resistance, such as a rheostat, or any other suitable circuit element or arrangement capable of controlling the conductivity of the output tubes.

BRIEF DESCRIPTION OF THE DRAWINGS

The figure shows the push-pull output stage of a high power vacuum tube amplifier incorporating the present invention.

DETAILED DESCRIPTION OF THE PREFERRED EMBODIMENT

The figure shows the preferred embodiment of the present invention incorporated in the output stage of a high power vacuum tube amplifier. The circuit shown in the figure typically comprises the output stage of an amplifier for an electric instrument such as an electric guitar. The output stage is configured in the form of a push-pull amplifier which utilizes a pair of pentode vacuum tubes 10 and 11, each including a cathode, anode or plate, control grid and a pair of screen grids. A push-pull configuration is used to amplify both the positive and negative portions of signals received from a phase inverter tube (not shown), which is coupled to the output stage through a pair of contacts 12 and 13 and corresponding coupling capacitors 14 and 15. Typically, the phase inverter tube is driven by a tone control stage, which in turn, is driven by a pre-amp connected to the electric instrument.

In accordance with traditional amplifier design, one of the screen grids, commonly referred to as a suppressor grid, of pentodes 10 and 11 is connected to the cathode of the tube, while the other is coupled to a fixed positive potential. Thus, suppressor grids 16 and 17 of tubes 10 and 11 are connected to cathodes 18 and 19, respectively of tubes 10 and 11, while screen grids 20 and 21 of tubes 10 and 11 are coupled to a fixed positive potential 22 of 535 volts DC through isolation resistors 23 and 24, respectively. In the embodiment shown in FIG. 1 potential 22 is provided by a constant screen voltage supply (not shown).

The control grids 25 and 26 of tubes 10 and 11 are both biased through an isolation resistor 27 and 28, respectively, with a negative fixed voltage 29 in accordance with traditional fixed biased design. In the preferred embodiment shown in the figure negative bias 29 is equal to $-65$ volts DC.

Cathodes 18 and 19, however, are not tied to ground in accordance with traditional fixed biased design. Rather, in accordance with the present invention, cathodes 18 and 19 are joined together by a common connection 30, which in turn, is coupled to ground through a variable resistor 31. This resistor is preferably a high wattage rheostat, although it is to be understood that other suitable circuit elements or arrangements providing a variable impedance may also be used. In the preferred embodiment resistor 31 is a 200 ohm, 5 watt rheostat. Connected in parallel with rheostat 31 is a bypass capacitor 32 which keeps tubes 10 and 11 in perfect balance when they are operated in a power output mode lower than full power.

The anodes or plates 33 and 34 of tubes 10 and 11 alternately drive an output transformer 34, which in turn drives a load (not shown) such as speakers having an impedance in the range of 4–8 ohms. Transformer 34 is comprised of a d to anode 33 primary winding 35 having a first end 36 connected to anode 33 and a second end 37 connected to anode 34, and a secondary winding 38 connected to the load. Also included in primary wind 35 is a center tap 39 coupled to a positive potential 40 of 545V DC for supplying power to tubes 10 and 11.

Rheostat 31 can be appropriately varied to adjust the level of power delivered by the output stage shown in the figure to any level within a specified range. If rheostat 31 is varied in the direction of zero ohms, the conductivity of tubes 10 and 11 is caused to increase. Maximum conductivity is reached when rheostat 31 is adjusted to zero ohms so that cathodes 33 and 34 are connected directly to ground. At this setting, the output stage of the amplifier will deliver "full" power. Conversely, if rheostat 31 is varied in the direction of its maximum value of 200 ohms, the conductivity of tubes 10 and 11 is caused to decrease, and thus, the level of power delivered by the amplifier is reduced. "Minimum" power is delivered when rheostat 31 is set to its maximum value.

The negative bias applied to control grids 25 and 26 allows the potential at cathodes 18 and 19 to be varied without introducing distortion into the amplifier. Thus, resistor 31 can be varied at will to control the conductivity of output tubes 10 and 11 so as to vary the output power of the amplifier to any level within a specified range. In the preferred embodiment shown in FIG. 1, the maximum power that can be delivered by the amplifier is approximately 100 watts RMS, while minimum power is approximately 10 watts RMS. Thus, with the embodiment shown in FIG. 1 an output power of 10, 20, 37, 46, 59, 76 or 100 watts RMS, or any other power level between 10 and 100 watts RMS can be delivered without distortion and without damaging power tubes 10 and 11. Such variability allows a user to limit the power output by the amplifier in accordance with the needs of the size of the location in which the amplifier is being used. When coupled with a pre-amp having the appropriate gain, the output stage will be overdriven, allowing the introduction of clean distortion to achieve a desired effect such as altering the tone of the signal derived from the amplifier.

It will be readily seen by those skilled in the related art that other ranges of output power can be used with the present invention by varying the biasing levels and/or circuit components shown in the figure accordingly. In such instances, negative biasing on the control grids of the output tubes would still be used and output power would still be controlled by varying the conductivity of such output tubes in accordance with the present invention.

It is to be understood that a number of variations may be made in the invention without departing from its spirit and scope. The terms and expressions which have been employed are used in a descriptive and not a limiting sense, and no intention of excluding equivalents of the invention described and claimed is made.

What is claimed is:

1. An output stage for a power amplifier comprising:
   a first vacuum tube comprised of a first plate, a first cathode and a first control grid, said first vacuum tube driving a load through said first plate,
   a second vacuum tube comprised of a second plate, a second cathode and a second control grid, said second vacuum tube driving said load through said second plate,
   means for biasing said first and second control grids with a negative fixed voltage, and
   a variable impedance, responsive to manual adjustment, for selecting the output power of said first and second vacuum tubes, said variable impedance for varying, independently of input or output signals or circuit biasing, the potential at said first cathode of the first vacuum tube and said second cathode of the second vacuum tube between ground and a predetermined voltage level above said ground, and thereby, the conductivity of said first and second vacuum tubes so that any level of output power within a specified range can be selected by said manual adjustment and the tone of an audio signal supplied to said power amplifier can be selectively modified.

2. An output stage as recited in claim 1 wherein said variable impedance is adjustable between a mininum and a maximum for varying the conductivity of said first and second vacuum tubes, and thereby, the level of power output by the power amplifier, between a maximum and a minimum, respectively.

3. An output stage as recited in claim 1 or 2 wherein said biasing means is a plurality of resistors connected between said first and second control grids and a negative fixed voltage supply.

4. An output stage as recited in claim 1 or 2 wherein first and second cathode are joined by a common connection, and wherein said variable impedance is a variable resistance connected between said common connection and said ground.

5. In a power amplifier including an output stage comprised of first and second vacuum tubes configured in the form of a push-pull amplifier, the improvement comprising a biasing and control circuit for varying the power output of the push-pull amplifier comprising:
  means for biasing a first control grid of the first vacuum tube and a second control grid of the second vacuum tube with a negative fixed voltage, and
  a variable impedance, responsive to manual adjustment, for selecting the output power of said first and second vacuum tubes, said variable impedance for varying, independently of input or output signals or circuit biasing, the potential at a first cathode of the first vacuum tube and a second cathode of the second vacuum tube between ground and a predetermined voltage level above said ground, and thereby, the conductivity of said first and second vacuum tubes so that any level of output power within a specified range can be selected by said manual adjustment and the tone of an audio signal supplied to said power amplifier can be selectively modified.

6. A biasing circuit as recited in claim 5 wherein when said variable impedance is adjusted to a mininum, the output power is at a maximum, and wherein when said variable impedance is adjusted to a maximum, the output power is at a minimum.

7. A biasing circuit as recited in claim 6 wherein said first and second cathodes are joined by a common connection, and wherein said variable impedance is a variable resistance connected between said common connection and said ground.

8. A biasing circuit as recited in claim 7 wherein said biasing means is a plurality of resistors, and wherein at least one of said resistors is connected between each of said first and second control grids and a power supply generating said negative fixed voltage.

* * * * *